United States Patent [19]
Dozier, II et al.

[11] Patent Number: 5,820,014
[45] Date of Patent: Oct. 13, 1998

[54] SOLDER PREFORMS

[75] Inventors: Thomas H. Dozier, II, Carrolton, Tex.; Igor Y. Khandros, Orinda, Calif.

[73] Assignee: Form Factor, Inc., Livermore, Calif.

[21] Appl. No.: 584,981

[22] Filed: Jan. 11, 1996

Related U.S. Application Data

[63] Continuation-in-part of Ser. No. 533,584, Oct. 18, 1995, Pat. No. 5,772,451, and Ser. No. 452,255, May 26, 1995, which is a continuation-in-part of Ser. No. 340,144, Nov. 15, 1994, which is a continuation-in-part of Ser. No. 152,812, Nov. 16, 1993, Pat. No. 5,476,211.

[51] Int. Cl.$^6$ .................................................. B23K 35/14
[52] U.S. Cl. ........................................ 228/56.3; 228/246
[58] Field of Search .................................. 228/56.3, 246

[56] References Cited

U.S. PATENT DOCUMENTS

| 2,923,859 | 2/1960 | Worth et al. | 317/101 |
|---|---|---|---|
| 3,047,683 | 7/1962 | Schlesinger, Jr. | 200/26 |

(List continued on next page.)

FOREIGN PATENT DOCUMENTS

| 1026876 | 3/1958 | Germany . |  |
|---|---|---|---|
| 2232794 | 1/1973 | Germany . |  |
| 25 08 702 A1 | 9/1976 | Germany . |  |
| 2-105560 | 4/1990 | Japan . |  |
| 2-181958 | 9/1990 | Japan . |  |
| 3-138969 (A) | 6/1991 | Japan . |  |
| 3-225946 (A) | 10/1991 | Japan . |  |
| 1003-396-A | 2/1980 | U.S.S.R. . |  |
| 2167228 | 5/1985 | United Kingdom . |  |
| WO 94/03036 | 2/1994 | WIPO | H05K 3/36 |

OTHER PUBLICATIONS

D.A. Koop and T.F. Redmond, "Etched Braze Preform Sheet," *IBM Tech. Discl. Bull.*, vol. 13, No. 8, Jan. 1971, p. 2320.

*Plating Micro Bonding Used for Tape carrier Package*, Ando, et al., NIST, VLSI Packaging Workshop, Oct. 11–13, 1993, one page.
*MCM–To–Printed Wiring Board (Second Level) Connection Technology Options*, Knight, pp. 487–523.
*Elastomeric Connector for MCM and Test Applications*, Walker et al., ICEMM Proceedings, 1993, pp. 341–346.
*Electronic Materials and Processes Handbook*, Harper and Sampson, Second Edition, McGraw Hill, Inc., 1993, pp. 5.1–5.69.
*Ney Contact Manual*, Electrical Contacts for Low Energy Uses, Kenneth E. Pitney, Jan., 1973.
*Nickel Plating*, by Robert Brugger, Robert Draper Ltd. (UK), 1970.
*Printed Circuits in Space Technology*, Albert E. Linden, Prentice–Hall, Inc., 1962.
Copper Corrosion With and Without Inhibitors, Brusic, et al., J. Electrochemical Society, vol. 138, pp 2253–2259, No. 8, Aug. 1991.
Electroplating Technology, Duffy, Noyes Data Corporation, 1981.

*Primary Examiner*—Patrick Ryan
*Assistant Examiner*—Jeffrey T. Knapp
*Attorney, Agent, or Firm*—David J. Larwood; Gerald E. Linden

[57] ABSTRACT

Method and apparatus for forming solder balls on electronic components and for forming solder joints between electronic components is described. A preform is fabricated having relatively large cross-section solder masses connected to one another by relatively small cross-section solder bridges. Upon reheating (reflow heating), the solder bridges melt first, and become subsumed into the solder masses. In instances where the preform is placed on a surface of an electronic component and reflowed, the solder masses become solder balls on pads of the electronic component. In instances where the preform is placed between two electronic components and reflowed, the solder masses become solder joints connecting the two electronic components. The preform may be prefabricated with a carrier, for later application to or between electronic components, and may be used to form solder balls on one or more unsingulated semiconductor dies on a semiconductor wafer.

16 Claims, 6 Drawing Sheets

U.S. PATENT DOCUMENTS

| | | | |
|---|---|---|---|
| 3,070,650 | 12/1962 | Stearns | 174/88 |
| 3,075,282 | 1/1963 | McConville | 29/155.55 |
| 3,202,489 | 8/1965 | Bender et al. | 29/195 |
| 3,258,736 | 6/1966 | Crawford et al. | 339/252 |
| 3,281,751 | 10/1966 | Blair | 339/17 |
| 3,286,340 | 11/1966 | Kritzler et al. | 29/471.1 |
| 3,296,692 | 1/1967 | Griffin | 29/472.9 |
| 3,302,067 | 1/1967 | Jackson et al. | 317/101 |
| 3,344,228 | 9/1967 | Woodland et al. | 174/107 |
| 3,368,114 | 2/1968 | Campbell et al. | 317/101 |
| 3,373,481 | 3/1968 | Lins et al. | 29/471.3 |
| 3,389,457 | 6/1968 | Goldman et al. | 29/580 |
| 3,390,308 | 6/1968 | Marley | 317/100 |
| 3,392,442 | 7/1968 | Napier et al. | 29/628 |
| 3,397,451 | 8/1968 | Avedissian et al. | 29/589 |
| 3,426,252 | 2/1969 | Lepselter | 317/234 |
| 3,429,040 | 2/1969 | Miller | 29/626 |
| 3,460,238 | 8/1969 | Christy et al. | 227/111 |
| 3,467,765 | 9/1969 | Croft | 174/94 |
| 3,472,365 | 10/1969 | Tiedema | 206/56 |
| 3,474,297 | 10/1969 | Bylander | 317/101 |
| 3,487,541 | 1/1970 | Boswell | 29/626 |
| 3,495,170 | 2/1970 | Biard et al | 324/62 |
| 3,509,270 | 4/1970 | Dube et al. | 29/625 |
| 3,517,438 | 6/1970 | Johnson et al. | 29/627 |
| 3,550,645 | 12/1970 | Keough | 140/92.2 |
| 3,555,477 | 1/1971 | Hildebtandt | 336/192 |
| 3,567,846 | 3/1971 | Brorein et al. | 174/102 |
| 3,569,610 | 3/1971 | Gardner et al. | 174/102 |
| 3,590,480 | 7/1971 | Johnson, Jr. | 29/605 |
| 3,591,839 | 7/1971 | Evans | 317/234 |
| 3,611,061 | 10/1971 | Segerson | 317/234 R |
| 3,614,832 | 10/1971 | Chance et al. | 29/626 |
| 3,616,532 | 11/1971 | Beck | 174/68.5 |
| 3,623,649 | 11/1971 | Keisling | 228/15 |
| 3,627,124 | 12/1971 | Hance | 209/45 |
| 3,672,047 | 6/1972 | Sakamoto et al. | 29/628 |
| 3,673,681 | 7/1972 | Steranko | 29/626 |
| 3,680,037 | 7/1972 | Nellis et al. | 339/61 M |
| 3,680,206 | 8/1972 | Roberts | 29/580 |
| 3,683,105 | 8/1972 | Shamash et al. | 174/68.5 |
| 3,689,991 | 9/1972 | Aird | 20/577 |
| 3,719,981 | 3/1973 | Steitz | 29/423 |
| 3,724,068 | 4/1973 | Galli | 29/626 |
| 3,772,575 | 11/1973 | Hegarty et al. | 317/235 R |
| 3,778,532 | 12/1973 | Braden | 228/56.3 |
| 3,795,037 | 3/1974 | Luttmer | 229/628 |
| 3,795,884 | 3/1974 | Kotaka | 339/17 LM |
| 3,811,186 | 5/1974 | Larnerd et al. | 29/626 |
| 3,825,353 | 7/1974 | Loro | 317/234 R |
| 3,832,769 | 9/1974 | Olyphant, Jr. et al. | 29/626 |
| 3,839,727 | 10/1974 | Herdzik et al. | 357/71 |
| 3,842,189 | 10/1974 | Southgate | 174/52 S |
| 3,861,135 | 1/1975 | Seeger, Jr. et al. | 58/50 R |
| 3,862,790 | 1/1975 | Davies et al. | 339/17 M |
| 3,862,791 | 1/1975 | Miller | 339/198 R |
| 3,864,728 | 2/1975 | Peltz et al. | 357/71 |
| 3,868,724 | 2/1975 | Perrino | 357/65 |
| 3,871,014 | 3/1975 | King et al. | 357/67 |
| 3,871,015 | 3/1975 | Lin et al. | 357/67 |
| 3,873,173 | 3/1975 | Anhault | 339/17 CF |
| 3,877,064 | 4/1975 | Scheingold et al. | 357/74 |
| 3,900,153 | 8/1975 | Beerwerth et al. | 228/246 |
| 3,904,262 | 9/1975 | Cutchaw | 339/17 CF |
| 3,917,900 | 11/1975 | Arnaudin | 174/107 |
| 3,921,285 | 11/1975 | Krall | 29/626 |
| 3,926,360 | 12/1975 | Moister, Jr. | 228/180 |
| 3,939,559 | 2/1976 | Fendley et al. | 29/628 |
| 3,940,786 | 2/1976 | Scheingold et al. | 357/74 |
| 3,982,320 | 9/1976 | Buchoff et al. | 29/630 R |
| 3,984,166 | 10/1976 | Hutchison | 339/17 CF |
| 3,990,689 | 11/1976 | Eklund, Sr. | 269/21 |
| 3,991,463 | 11/1976 | Squitieri et al. | 29/629 |
| 4,003,621 | 1/1977 | Lamp | 339/59 M |
| 4,009,485 | 2/1977 | Koenig | 357/68 |
| 4,034,468 | 7/1977 | Koopman | 29/628 |
| 4,067,104 | 1/1978 | Tracy | 29/626 |
| 4,074,342 | 2/1978 | Honn et al. | 361/411 |
| 4,080,722 | 3/1978 | Klatskin et al. | 29/580 |
| 4,139,936 | 2/1979 | Abrams et al. | 29/624 |
| 4,142,288 | 3/1979 | Flammer et al. | 29/628 |
| 4,149,135 | 4/1979 | Roespel et al. | 336/65 |
| 4,155,615 | 5/1979 | Zimmerman, Jr. | 339/14 L |
| 4,161,692 | 7/1979 | Tarzwell | 324/158 P |
| 4,179,802 | 12/1979 | Joshi et al. | 29/628 |
| 4,189,825 | 2/1980 | Robillard et al. | 29/574 |
| 4,195,193 | 3/1980 | Grabbe et al. | 174/52 FP |
| 4,216,350 | 8/1980 | Reid | 174/68.5 |
| 4,225,900 | 9/1980 | Ciccio et al. | 361/395 |
| 4,231,154 | 11/1980 | Gazdik et al. | 29/840 |
| 4,237,607 | 12/1980 | Ohno | 29/840 |
| 4,272,140 | 6/1981 | Lychyk et al. | 339/17 CF |
| 4,278,311 | 7/1981 | Scheingold et al. | 339/17 CF |
| 4,295,700 | 10/1981 | Sado | 339/61 M |
| 4,312,117 | 1/1982 | Robillards et al. | 29/589 |
| 4,322,778 | 3/1982 | Barbour et al. | 361/414 |
| 4,326,663 | 4/1982 | Oettel | 228/123 |
| 4,330,165 | 5/1982 | Sado | 339/59 |
| 4,332,341 | 6/1982 | Minetti | 228/180 A |
| 4,356,374 | 10/1982 | Noyori et al. | 219/121 PE |
| 4,374,457 | 2/1983 | Wiech, Jr. | 29/591 |
| 4,385,202 | 5/1983 | Spinelli et al. | 174/68.5 |
| 4,396,935 | 8/1983 | Schuck | 357/74 |
| 4,402,450 | 9/1983 | Abraham et al. | 228/180 A |
| 4,407,007 | 9/1983 | Desai et al. | 357/74 |
| 4,408,218 | 10/1983 | Grabbe | 357/70 |
| 4,410,905 | 10/1983 | Grabbe | 357/80 |
| 4,412,642 | 11/1983 | Fisher | 228/173 R |
| 4,417,392 | 11/1983 | Ibrahim et al. | 29/840 |
| 4,418,857 | 12/1983 | Ainslie et al. | 228/124 |
| 4,419,818 | 12/1983 | Grabbe | 29/832 |
| 4,422,568 | 12/1983 | Elles et al. | 228/111 |
| 4,442,938 | 4/1984 | Murphy | 206/329 |
| 4,442,967 | 4/1984 | van de Pas et al. | 228/159 |
| 4,447,857 | 5/1984 | Marks et al. | 361/395 |
| 4,453,176 | 6/1984 | Chance et al. | 357/51 |
| 4,462,534 | 7/1984 | Bitaillou et al. | 228/180 A |
| 4,472,762 | 9/1984 | Spinelli et al. | 361/386 |
| 4,509,099 | 4/1985 | Takamatsu et al. | 361/413 |
| 4,513,355 | 4/1985 | Schroeder et al. | 361/403 |
| 4,514,750 | 4/1985 | Adams | 357/70 |
| 4,520,561 | 6/1985 | Brown | 29/840 |
| 4,525,383 | 6/1985 | Saito | 427/89 |
| 4,532,152 | 7/1985 | Elarde | 427/96 |
| 4,542,438 | 9/1985 | Yamamoto | 361/403 |
| 4,545,610 | 10/1985 | Lakritz et al. | 29/589 |
| 4,546,406 | 10/1985 | Spinelli et al. | 361/386 |
| 4,547,833 | 10/1985 | Sharp | 361/386 |
| 4,551,746 | 11/1985 | Gilbert et al. | 357/74 |
| 4,553,192 | 11/1985 | Babuka et al. | 361/395 |
| 4,557,411 | 12/1985 | Farquharson et al. | 228/56.3 |
| 4,574,470 | 3/1986 | Burt | 29/590 |
| 4,581,291 | 4/1986 | Bongianni | 428/381 |
| 4,595,794 | 6/1986 | Wasserman | 174/138 |
| 4,597,522 | 7/1986 | Kobayashi | 228/179 |
| 4,597,617 | 7/1986 | Enochs | 339/17 CF |
| 4,600,138 | 7/1986 | Hill | 228/179 |
| 4,604,644 | 8/1986 | Beckham et al. | 357/80 |
| 4,615,573 | 10/1986 | White et al. | 339/17 M |
| 4,627,151 | 12/1986 | Mulholland et al. | 29/569 R |
| 4,628,406 | 12/1986 | Smith et al. | 361/386 |
| 4,628,410 | 12/1986 | Goodman et al. | 361/413 |

| | | | | | | | |
|---|---|---|---|---|---|---|---|
| 4,634,199 | 1/1987 | Anhalt et al. | 339/17 M | 4,902,606 | 2/1990 | Patraw | 430/314 |
| 4,640,499 | 2/1987 | Hemler et al. | 267/160 | 4,903,120 | 2/1990 | Beene et al. | 357/74 |
| 4,641,176 | 2/1987 | Keryhuel et al. | 357/74 | 4,903,889 | 2/1990 | Svendsen et al. | 228/180.2 |
| 4,641,426 | 2/1987 | Hartman et al. | 29/839 | 4,907,734 | 3/1990 | Conru et al. | 228/123 |
| 4,642,889 | 2/1987 | Grabbe | 29/840 | 4,914,814 | 4/1990 | Behun et al. | 29/843 |
| 4,646,435 | 3/1987 | Grassauer | 29/840 | 4,918,811 | 4/1990 | Eichelberger | 29/840 |
| 4,647,126 | 3/1987 | Sobota | 339/17 CF | 4,922,376 | 5/1990 | Pommer et al. | 361/386 |
| 4,647,959 | 3/1987 | Smith | 357/74 | 4,924,353 | 5/1990 | Patraw | 361/400 |
| 4,649,415 | 3/1987 | Herbert | 357/74 | 4,926,241 | 5/1990 | Carey | 357/75 |
| 4,661,192 | 4/1987 | McShane | 156/292 | 4,931,149 | 6/1990 | Stierman et al. | 204/15 |
| 4,664,309 | 5/1987 | Allen et al. | 228/180.2 | 4,932,902 | 6/1990 | Crane, Jr. | 439/627 |
| 4,667,219 | 5/1987 | Lee et al. | 357/68 | 4,937,203 | 6/1990 | Eichelberger et al. | 437/51 |
| 4,670,770 | 6/1987 | Tai | 357/60 | 4,941,033 | 7/1990 | Kishida | 357/75 |
| 4,673,967 | 6/1987 | Hingorany | 357/70 | 4,942,140 | 7/1990 | Ootsuki et al. | 437/211 |
| 4,677,458 | 6/1987 | Morris | 357/74 | 4,943,845 | 7/1990 | Wilby | 357/74 |
| 4,681,654 | 7/1987 | Clementi et al. | 156/630 | 4,954,878 | 9/1990 | Fox et al. | 357/81 |
| 4,685,998 | 8/1987 | Quinn et al. | 156/633 | 4,955,523 | 9/1990 | Calomagno et al. | 228/179 |
| 4,688,074 | 8/1987 | Iinuma | 357/79 | 4,956,749 | 9/1990 | Chang | 361/414 |
| 4,695,870 | 9/1987 | Patraw | 357/74 | 4,967,261 | 10/1990 | Niki et al. | 357/70 |
| 4,695,872 | 9/1987 | Chatterjee | 357/75 | 4,970,570 | 11/1990 | Agarwala et al. | 357/68 |
| 4,700,276 | 10/1987 | Freyman et al. | 361/403 | 4,975,079 | 12/1990 | Beaman et al. | 439/482 |
| 4,700,473 | 10/1987 | Freyman et al. | 29/846 | 4,982,264 | 1/1991 | Cragon et al. | 357/75 |
| 4,703,393 | 10/1987 | Yamamoto et al. | 361/405 | 4,989,069 | 1/1991 | Hawkins | 357/74 |
| 4,705,205 | 11/1987 | Allen | 228/180.2 | 5,006,673 | 4/1991 | Freyman et al. | 174/255 |
| 4,708,885 | 11/1987 | Saito et al. | 427/58 | 5,007,576 | 4/1991 | Congleton et al. | 228/103 |
| 4,709,468 | 12/1987 | Wilson | 437/209 | 5,012,187 | 4/1991 | Littlebury | 324/158 P |
| 4,710,798 | 12/1987 | Marcantonio | 357/80 | 5,014,111 | 5/1991 | Tsuda et al. | 357/68 |
| 4,716,049 | 12/1987 | Patraw | 427/96 | 5,024,372 | 6/1991 | Altman et al. | 228/248 |
| 4,721,993 | 1/1988 | Walter | 357/70 | 5,024,746 | 6/1991 | Stierman et al. | 204/297 W |
| 4,732,313 | 3/1988 | Kobayashi et al. | 228/179 | 5,025,306 | 6/1991 | Johnson et al. | 357/75 |
| 4,739,125 | 4/1988 | Watanabe et al. | 174/52 FP | 5,029,325 | 7/1991 | Higgins, III et al. | 357/80 |
| 4,746,300 | 5/1988 | Thevenin | 439/82 | 5,029,748 | 7/1991 | Lauterbach et al. | 228/56.3 |
| 4,750,089 | 6/1988 | Derryberry et al. | 361/388 | 5,041,901 | 8/1991 | Kitano et al. | 357/70 |
| 4,751,199 | 6/1988 | Phy | 437/209 | 5,045,921 | 9/1991 | Lin et al. | 357/74 |
| 4,751,482 | 6/1988 | Fukuta et al. | 333/247 | 5,047,830 | 9/1991 | Grabbe | 357/68 |
| 4,754,316 | 6/1988 | Reid | 357/68 | 5,053,922 | 10/1991 | Matta et al. | 361/386 |
| 4,757,256 | 7/1988 | Whann et al. | 324/158 P | 5,057,461 | 10/1991 | Fritz | 437/220 |
| 4,764,804 | 8/1988 | Sahara et al. | 357/81 | 5,059,557 | 10/1991 | Cragon et al. | 437/208 |
| 4,764,848 | 8/1988 | Simpson | 361/408 | 5,060,843 | 10/1991 | Yasuzato et al. | 228/179 |
| 4,767,344 | 8/1988 | Noschese | 439/83 | 5,065,281 | 11/1991 | Hernandez et al. | 361/388 |
| 4,772,936 | 9/1988 | Reding et al. | 357/80 | 5,066,907 | 11/1991 | Tarzwell et al. | 324/158 P |
| 4,777,564 | 10/1988 | Derfiny et al. | 361/405 | 5,067,007 | 11/1991 | Kanji et al. | 357/74 |
| 4,783,719 | 11/1988 | Jamison et al. | 361/398 | 5,071,359 | 12/1991 | Arnio et al. | 439/91 |
| 4,784,872 | 11/1988 | Moeller et al. | 427/96 | 5,077,633 | 12/1991 | Freyman et al. | 361/403 |
| 4,793,814 | 12/1988 | Zifcak et al. | 439/66 | 5,083,697 | 1/1992 | Difrancesco | 230/116 |
| 4,796,078 | 1/1989 | Phelps, Jr. | 357/68 | 5,086,337 | 2/1992 | Noro et al. | 357/79 |
| 4,807,021 | 2/1989 | Okumura | 357/75 | 5,088,007 | 2/1992 | Missele | 361/386 |
| 4,811,082 | 3/1989 | Jacobs et al. | 357/80 | 5,095,187 | 3/1992 | Gliga | 219/68 |
| 4,814,295 | 3/1989 | Mehta | 437/209 | 5,097,100 | 3/1992 | Jackson | 174/94 R |
| 4,816,426 | 3/1989 | Bridges et al. | 437/207 | 5,106,784 | 4/1992 | Bednarz | 437/214 |
| 4,818,728 | 4/1989 | Rai et al. | 437/209 | 5,110,032 | 5/1992 | Akiyama et al. | 228/102 |
| 4,818,823 | 4/1989 | Bradley | 174/68.5 | 5,118,027 | 6/1992 | Braun et al. | 228/180.2 |
| 4,821,148 | 4/1989 | Kobayashi et al. | 361/392 | 5,123,850 | 6/1992 | Elder et al. | 439/67 |
| 4,827,611 | 5/1989 | Pai et al. | 29/843 | 5,127,570 | 7/1992 | Steitz et al. | 228/103 |
| 4,837,622 | 6/1989 | Whann et al. | 324/158 P | 5,128,612 | 7/1992 | Aton | 324/158 |
| 4,842,184 | 6/1989 | Miller | 228/180.1 | 5,130,779 | 7/1992 | Agarwala et al. | 357/67 |
| 4,855,867 | 8/1989 | Gadzik | 361/306 | 5,130,783 | 7/1992 | McLellan | 357/74 |
| 4,857,482 | 8/1989 | Saito et al. | 437/209 | 5,131,852 | 7/1992 | Grabbe et al. | 439/71 |
| 4,858,819 | 8/1989 | Hill et al. | 228/179 | 5,134,462 | 7/1992 | Freyman et al. | 357/74 |
| 4,860,433 | 8/1989 | Miura | 29/605 | 5,136,366 | 8/1992 | Worp et al. | 357/72 |
| 4,861,452 | 8/1989 | Stierman et al. | 204/297 W | 5,136,367 | 8/1992 | Chiu | 357/74 |
| 4,868,638 | 9/1989 | Hirata et al. | 357/72 | 5,147,084 | 9/1992 | Behun et al. | 228/56.3 |
| 4,874,476 | 10/1989 | Stierman et al. | 204/15 | 5,148,265 | 9/1992 | Khandros et al. | 357/80 |
| 4,874,721 | 10/1989 | Kimura et al. | 437/209 | 5,148,266 | 9/1992 | Khandros et al. | 357/80 |
| 4,874,722 | 10/1989 | Bednarz et al. | 437/209 | 5,148,968 | 9/1992 | Schmidt et al. | 228/180.2 |
| 4,878,098 | 10/1989 | Saito et al. | 357/68 | 5,152,055 | 10/1992 | Grabbe et al. | 439/71 |
| 4,878,611 | 11/1989 | Lo Vasco et al. | 228/180.2 | 5,154,341 | 10/1992 | Melton et al. | 228/180.2 |
| 4,878,846 | 11/1989 | Schroeder | 439/65 | 5,157,325 | 10/1992 | Murphy | 324/158 F |
| 4,884,122 | 11/1989 | Eichelberger et al. | 357/71 | 5,173,055 | 12/1992 | Grabbe | 439/66 |
| 4,887,148 | 12/1989 | Mu | 357/74 | 5,180,977 | 1/1993 | Huff | 324/158 P |
| 4,890,194 | 12/1989 | Derryberry | 361/386 | 5,185,073 | 2/1993 | Bindra et al. | 205/104 |
| 4,893,172 | 1/1990 | Matsumoto et al. | 357/79 | 5,189,507 | 2/1993 | Carlomagno et al. | 257/777 |

| | | | |
|---|---|---|---|
| 5,192,018 | 3/1993 | Terakado et al. | 228/179 |
| 5,192,681 | 3/1993 | Chiu | 437/217 |
| 5,196,268 | 3/1993 | Fritz | 428/458 |
| 5,198,153 | 3/1993 | Angelopoulos et al. | 252/500 |
| 5,200,112 | 4/1993 | Angelopoulos et al. | 252/500 |
| 5,201,454 | 4/1993 | Alfaro et al. | 228/110 |
| 5,202,061 | 4/1993 | Angelopoulos et al. | 252/500 |
| 5,214,563 | 5/1993 | Estes | 361/386 |
| 5,217,597 | 6/1993 | Moore et al. | 205/123 |
| 5,218,292 | 6/1993 | Goto | 324/158 F |
| 5,221,815 | 6/1993 | Bostock et al. | 174/84 R |
| 5,227,662 | 7/1993 | Ohno et al. | 257/676 |
| 5,237,203 | 8/1993 | Massaron | 257/688 |
| 5,239,199 | 8/1993 | Chiu | 257/706 |
| 5,239,447 | 8/1993 | Cotues et al. | 361/744 |
| 5,241,133 | 8/1993 | Mullen, III et al. | 174/52.4 |
| 5,242,097 | 9/1993 | Socha | 228/56.3 |
| 5,246,159 | 9/1993 | Kitamura | 228/179 |
| 5,258,330 | 11/1993 | Khandros et al. | 437/209 |
| 5,263,246 | 11/1993 | Aoki | 29/843 |
| 5,282,312 | 2/1994 | DiStefano et al. | 29/830 |
| 5,283,104 | 2/1994 | Aoude et al. | 428/195 |
| 5,285,949 | 2/1994 | Oikawa et al. | 228/179.1 |
| 5,288,007 | 2/1994 | Interrante et al. | 228/119 |
| 5,289,346 | 2/1994 | Carey et al. | 361/777 |
| 5,294,039 | 3/1994 | Pai et al. | 228/180.22 |
| 5,299,939 | 4/1994 | Walker et al. | 439/74 |
| 5,306,670 | 4/1994 | Mowatt et al. | 437/209 |
| 5,308,797 | 5/1994 | Kee | 437/209 |
| 5,313,368 | 5/1994 | Volz et al. | 361/774 |
| 5,316,204 | 5/1994 | Takehashi et al. | 228/179.1 |
| 5,317,479 | 5/1994 | Pai et al. | 361/773 |
| 5,321,277 | 6/1994 | Sparks et al. | 257/48 |
| 5,326,643 | 7/1994 | Adamopoulos et al. | 428/472.2 |
| 5,327,327 | 7/1994 | Frew et al. | 361/784 |
| 5,331,203 | 7/1994 | Wojnarowski et al. | 257/698 |
| 5,337,475 | 8/1994 | Aoude et al. | 29/852 |
| 5,338,705 | 8/1994 | Harris et al. | 437/217 |
| 5,339,027 | 8/1994 | Woith et al. | 324/754 |
| 5,346,861 | 9/1994 | Khandros et al. | 437/209 |
| 5,347,159 | 9/1994 | Khandros et al. | 257/692 |
| 5,347,162 | 9/1994 | Pasch | 257/773 |
| 5,350,947 | 9/1994 | Takekawa et al. | 257/702 |
| 5,359,493 | 10/1994 | Chiu | 361/719 |
| 5,366,380 | 11/1994 | Reymond | 439/66 |
| 5,367,764 | 11/1994 | DiStefano et al. | 29/830 |
| 5,378,982 | 1/1995 | Feigenbaum et al. | 324/770 |
| 5,379,191 | 1/1995 | Carey et al. | 361/777 |
| 5,381,848 | 1/1995 | Trabucco | 164/102 |
| 5,382,898 | 1/1995 | Subramanian | 324/754 |
| 5,386,344 | 1/1995 | Beaman et al. | 361/785 |
| 5,388,327 | 2/1995 | Trabucco | 29/830 |
| 5,390,844 | 2/1995 | Distefano et al. | 228/120.21 |
| 5,397,245 | 3/1995 | Roebuck et al. | 439/264 |
| 5,398,863 | 3/1995 | Grube et al. | 228/106 |
| 5,399,982 | 3/1995 | Driller et al. | 324/754 |
| 5,414,298 | 5/1995 | Grube et al. | 257/690 |
| 5,414,299 | 5/1995 | Wang et al. | 257/702 |
| 5,422,574 | 6/1995 | Kister | 324/754 |
| 5,424,652 | 6/1995 | Hembree et al. | 324/765 |
| 5,432,677 | 7/1995 | Mowatt | 361/719 |
| 5,435,482 | 7/1995 | Variot et al. | 228/254 |
| 5,442,282 | 8/1995 | Rostoker et al. | 324/158.1 |
| 5,448,106 | 9/1995 | Fujitsu | 257/668 |
| 5,453,583 | 9/1995 | Rostoker et al. | 174/267 |

SOLDER PREFORMS

CROSS-REFERENCE TO RELATED APPLICATIONS

This is a continuation-in-part of commonly-owned, U.S. patent application Ser. No. 08/533,584, filed Oct. 18, 1995 (status: now U.S. Pat. No. 5,772,451).

This is a continuation-in-part of commonly-owned, copending U.S. patent application Ser. No. 08/452,255, filed May 26, 1995 (status: pending), which is a continuation-in-part of commonly-owned, copending U.S. patent application Ser. No. 08/340,144, filed Nov. 15, 1994 (status: pending), which is a continuation-in-part of commonly-owned, copending U.S. patent application Ser. No. 08/152,812, filed Nov. 16, 1993 (now U.S. Pat. No. 5,476,211, issued Dec. 19, 1995).

TECHNICAL FIELD OF THE INVENTION

The invention relates to forming solder balls on electronic components and to effecting solder connections between electronic components.

BACKGROUND OF THE INVENTION

Electronic components, particularly microelectronic components such as semiconductor devices (chips), often have a plurality of terminals (also referred to as pads, bond pads, electrodes, or conductive areas). In order to assemble such devices into a useful system (or subsystem), a number of individual devices must be electrically interconnected with one another and/or with other electronic components, typically through the intermediary of a printed circuit (or wiring) board (PCB, PWB) or substrate.

Semiconductor devices are typically disposed within a semiconductor package having a plurality of external connection points in the form of pins, pads, leads, solder balls, and the like. Many types of semiconductor packages are known, and techniques for connecting the semiconductor device within the package include bond wires, tape-automated bonding (TAB) and the like. In some cases, a semiconductor device is provided with raised bump contacts, and is connected by flip-chip techniques onto another electronic component.

One type of semiconductor package is typified by U.S. Pat. No. 4,700,276 ("FREYMAN"), entitled ULTRA HIGH DENSITY PAD ARRAY CHIP CARRIER. As generally disclosed therein, a ceramic substrate is provided with a plurality of through holes plugged with solder on its bottom surface. These solder plugs (206) are arranged in an array pattern, and form external surface mount interconnection points for the final chip carrier arrangement. The solder plugs are generally hemispherical, and permit the substrate to sit high above the board to which the carrier is mounted. A semiconductor package having an array of solder balls as its interconnection points on an external surface thereof is referred to herein as a Ball Grid Array (BGA) type package.

Generally, BGA solder balls are of two types: (1) eutectic masses that melt upon reflow; and (2) masses such as of 90:10 lead:tin that are not melted, but rather are attached with a eutectic material. The first type of solder ball will collapse slightly (e.g., approximately 6 mils) upon reflow, therefore reducing concerns over maintaining initial coplanarity of the solder balls.

The second type of solder ball does not collapse, since they are not reflowed. Therefore, maintaining initial coplanarity of the solder balls is a concern.

For both types of solder balls, the temperature required to mount the solder balls to an electronic component is relevant. For low temperature attach methods (e.g., typical eutectic materials), the solder balls can be attached to a wide variety of electronic components. For high temperature attach methods (e.g., brazing), or for certain attach materials requiring high temperatures, the solder balls cannot readily be attached to certain electronic components that cannot withstand the heat associated with the attachment technique. This information is provided for general background purposes.

An aspect of the present invention is directed to techniques for forming solder balls and/or raised solder bumps on electronic components, particularly on chip carriers, semiconductor devices or semiconductor packages. In the main hereinafter, techniques for forming solder "balls" are discussed.

Techniques for forming solder balls and/or raised solder bumps on electronic components include, by way of example only:

(1) applying dollops (small quantities) of solder paste to contact pads and reflowing the solder paste;

(2) applying flux to contact pads, disposing solder balls on the fluxed pads, and reflowing the solder balls to attach the solder balls to the contact pads;

(3) solder-plugging plated areas (see, e.g., FIG. 2c of FREYMAN);

(4) molding solder ball contacts directly on a substrate (see, e.g., U.S..Pat. No. 5,381,848); and (5) filling holes in a film carrier with solder, placing the carrier over the substrate, and reflowing the solder to adhere to contact pads on the substrate (see, e.g., U.S. Pat. No. 5,388,327).

Other methods of forming raised solder contacts, of some relevance to the present invention, are the techniques disclosed in the aforementioned commonly-owned, copending U.S. patent applications Ser. Nos. 08/152,812, 08/340,144 and 08/452,255, which generally involve bonding a wire at two (both) ends to a terminal of an electronic component and overcoating the wire with solder. (See, e.g., FIGS. 24A and 24B of 08/452,255; FIG. 16 of 08/340,144; and FIGS. 2–5 of 08/152,812.)

Another aspect of the present invention is directed to connecting two or more electronic components to one another with solder joints.

BRIEF DESCRIPTION (SUMMARY) OF THE INVENTION

It is a general object of the present invention to provide a technique for fabricating interconnection elements for electronic components, including forming solder balls on an electronic component and forming solder joints between electronic components.

It is another object of the invention to provide a technique for forming solder balls and/or raised solder bumps on electronic components, particularly on chip carriers or semiconductor packages.

As used herein, the term "solder ball" refers to any mass of solder, or the like, providing a solderable, raised contact structure on a surface of an electronic component such as a semiconductor package or a support substrate. Such solder balls are traditionally employed to make soldered (e.g., permanent) electrical connections between the electronic component to which they are mounted and terminals of another electronic component.

Reference is made to the aforementioned commonly-owned, copending U.S. patent application Ser. No. 08/533,584, incorporated by reference herein, which describes a technique for making pressure connections to solder balls (e.g., the solder balls of a BGA array) mounted on an electronic component.

According to the invention, a technique is disclosed for mounting solder balls on pads (contact areas, terminals) of an electronic component.

For example, this technique can be employed to mount solder balls on (attach solder balls to) the support substrates for LGA and BGA solder-down sockets which are disclosed in the aforementioned U.S. patent application Ser. No. 08/533,584.

For example, this technique can be employed to mount solder balls on (attach solder balls to) semiconductor dies prior to their being singulated from a semiconductor wafer.

Generally, the technique utilizes a solder preform that includes a plurality of large solid solder masses connected to one another by a plurality of smaller solder bridges. The solder preform is disposed against a surface of an electronic component whereupon it is desired to mount solder balls, and the solder preform is heated so as to reflow the solder masses and solder bridges. During reflow, the solder masses become solder balls, and the solder bridges are subsumed into the solder balls. Preferably, soldering flux or solder paste is provided on either the solder preform or on the pads of the electronic component prior to reflow heating.

Alternatively, the solder preform is disposed between opposing surfaces of two (or more) electronic components. Subsequent heating reflows the solder masses and solder bridges to effect connections between the two (or more) electronic components.

The solder preform can be tacked to the component upon which it is desired to form solder balls, or between the two (or more) components which are desired to be connected, by flux.

The solder preform can be sized to provide solder balls on one or more semiconductor devices (dies) prior to singulating the dies from a semiconductor wafer.

In an alternate embodiment of the invention, a plurality of relatively large solder masses are formed on a relatively thin sheet of solder. In contrast to bridges connecting the solder masses, they are all connected by a continuous sheet. During reflow, the sheet subsumes into the solder masses to form solder balls or solder joints.

According to an aspect of this embodiment of the invention, the sheet with solder masses (or, solder masses connected by bridges) can be pressed onto a circuit board having through holes (which may be plated through holes), with sufficient force that portions of the solder masses (or of the sheet underlying the solder masses) deform in an extrusion-like manner into the through holes to hold the solder preform in place against the circuit board for subsequent reflow of the solder preform into solder balls or solder joints. An exemplary benefit of this embodiment (and, to some extent, the previous embodiment) is that the solder preform acts as a shorting layer for any subsequent plating operations performed upon the circuit board, such as overcoating wirestems to form free-standing resilient contact structures, as discussed in the aforementioned U.S. patent application Ser. No. 08/533,584.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. Although the invention will be described in the context of these preferred embodiments, it should be understood that it is not intended to limit the spirit and scope of the invention to these particular embodiments.

DETAILED DESCRIPTION OF THE INVENTION

As mentioned hereinabove, it is generally desirable to mount solder balls or solder bumps on electronic components for use, such as the external interconnection points of semiconductor packages. It is also desirable to provide solder balls directly on semiconductor devices (i.e., bare, unpackaged semiconductor dies).

The aspect of the invention described hereinbelow deals with a novel technique for providing solder balls or solder bumps on electronic components. As used herein, the term "solder" includes conventional lead-tin (Pb-Sn) solder compositions or various proportions (including high, as well as low melting point solder compositions), as well as other solder or eutectic or low melting point compositions.

Figure 1A:
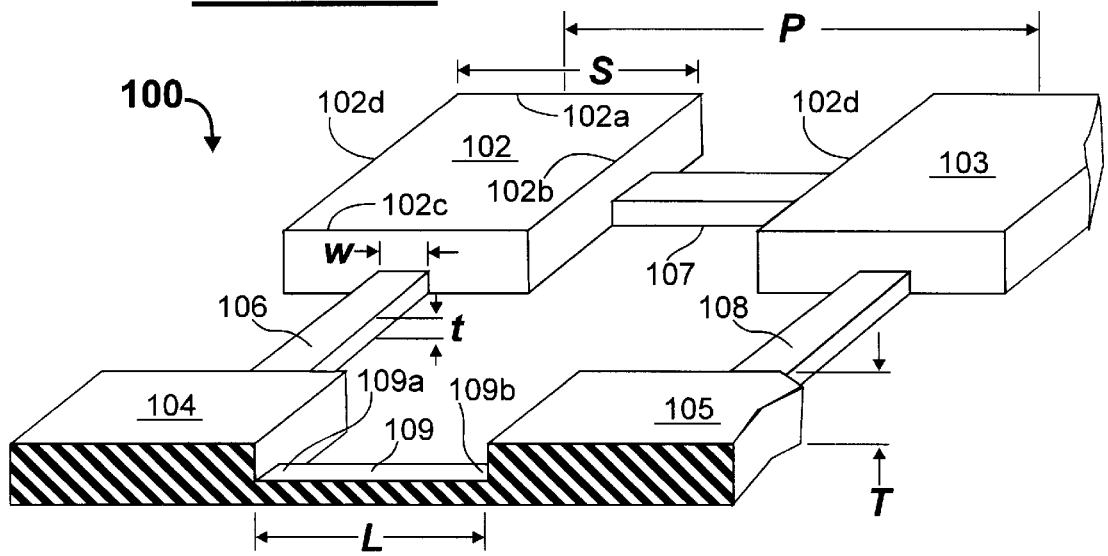
FIG. 1A is a perspective view, partially in cross-section, of a solder preform for use in attaching a plurality of solder ball type terminals to an electronic component (or, alternatively for joining two electronic components together) according to the invention.
Figure 1B:
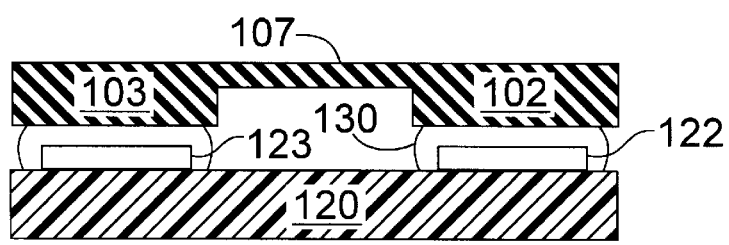
FIG. 1B is a side, cross-sectional view of the solder preform of FIG. 1A, in a subsequent step of the technique of attaching ball bumps to an electronic component, according to the invention.
Figure 1C:
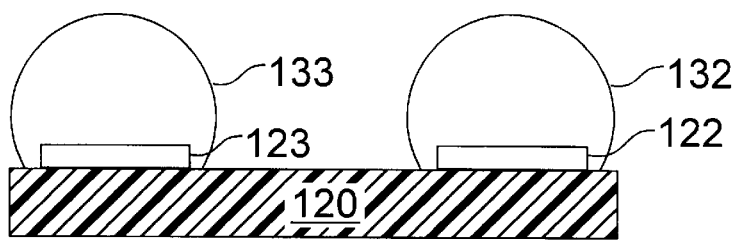
FIG. 1C is a side view, partially in cross-section, of ball bump terminals mounted to an electronic component, according to the invention.

FIGS. 1A–1C illustrate a technique of forming solder balls or solder bumps on an electronic component, according to the invention.

The electronic component can be a semiconductor device which has been singulated from a wafer, a semiconductor device prior to having been singulated from a semiconductor wafer, a semiconductor package, or the like.

FIG. 1A illustrates a preform (prefabricated structure) 100, formed of a solder material, having a plurality (two shown in full, two shown partially, of many) of spaced-apart, relatively large masses 102, 103, 104, 105 connected to one another by a plurality (three shown in full, one shown partially, of many) of relatively small solder bridges 106, 107, 108 and 109. (The bridges are considered to be relatively small solder masses.)

The solder masses 102 . . . 105 are relatively large, and are all preferably the same shape as one another. As illustrated, each solder mass, for example the solder mass 102 has four edges 102a, 102b, 102c and 102c, and is in a square shape. It is within the scope of this invention that the solder masses have shapes other than squares—for example, triangles or circles. The solder masses 102 . . . 105 have a thickness "T", and side dimension "S" (measured along an edge thereof).

The solder bridges 106 . . . 109 are relatively small, and are all preferably the same shape as one another. As illustrated, each solder bridge, for example the solder bridge 109 has two ends 109a and 109b, between which is defined a length "L". Each solder bridge 106 . . . 109 also has a width "W", and a thickness "t".

Exemplary dimensions for the solder masses 102 . . . 105 and solder bridges 106 . . . 109 are:

side dimension "S" of solder mass=35 mils;
thickness "T" of solder mass=12 mils;
length "L" of solder bridge=15 mils;
width "W" of solder bridge=5 mils; and
thickness "t" of solder bridge=6 mils.

In this manner, the solder masses 102 . . . 105 are uniformly arranged at a pitch "P" of 50 mils (P=L+2S/2). As is evident, the solder masses 102 . . . 105 have a much greater mass (including cross-sectional area) than the solder bridges 106 . . . 109. Hence, as will be evident, when subjected to sufficient heat to melt the solder masses and bridges, the solder bridges will melt first, and will be subsumed into the solder masses. As is evident, the solder bridges 106 . . . 109 will be quite "flimsy" (e.g., lacking in structural integrity) as compared with the solder masses 102 . . . 105. The final size (e.g., volume and radius) of solder balls created in this manner is readily calculated, based on the aforementioned dimensions of the solder preform, and vice-versa.

It is within the scope of this invention that the solder masses be arranged in a pattern other than the rectangular array illustrated in FIG. 1A, and that the solder masses and solder bridges have different dimensions than those set forth above. For example, a range of dimensions suitable for microelectronic applications would be:

"S" is in the range of from 10 mils to 90 mils;
"T" is in the range of from 2 mils to 25 mils;
"L" is in the range of from 5 mils of 60 mils (nominally 15 mils);
"W" is in the range of from 2 mils to 20 mils (nominally 5 mils); and
"t" is in the range of from 1 mils to 25 mils (nominally 10 mils).

Moreover, certain relationships, and preferred relationships, are evident from the exemplary dimensions and ranges of dimensions set forth hereinabove. For example (wherein "*" means multiply):

$S \geq L$, preferably $S \geq 1.5*L$;
$S >> W$, preferably $S \geq 5*W$;
$T >> t$, preferably $T \geq 2*t$;
$S > T$, preferably $S \geq 3*T$; and
$L > W$, preferably $L \geq 3*W$.

The preform 100 is readily fabricated by known techniques of molding or punching (e.g., cold forming), so that the masses 102 . . . 105 are formed integrally with the bridges 106 . . . 109.

The preform 100 may also be formed by masking a sheet of solder, and etching, in which case T≈t. Etching may be "half" (single-sided) etching, or double-sided etching.

In any case (i.e., however the preform is fabricated), the solder masses are readily fabricated to have a volume (mass, for a given material) S*S*T which is greater than (>) the volume L*W*t of the solder bridges. Preferably, the volume of a solder mass is at least 5 times greater than the volume of a solder bridge, including at least 10 times greater.

A preform 100 having thus been fabricated, it is now described how the preform is used to mount a plurality of external interconnect structures (i.e., as solder balls or solder bumps) to a surface of an electronic component.

FIG. 1B illustrates an electronic component 120 having a plurality (two of many shown) of conductive pads 122 and 123 disposed in any suitable manner on an external surface thereof. (Compare, e.g., the pads 54 shown in the aforementioned U.S. Pat. No. 5,241,133.) As will become evident, the pads (122 and 123) are arranged in a pattern matching the layout of the solder masses (102 and 103), including being disposed at a pitch matching that of the solder masses, or vice-versa. In practice, the pattern and pitch of the solder masses will be made to match the layout of the pads on the electronic component.

Solder paste 130, preferably containing flux, is applied to the pads 122 and 123 by any suitable process such as by screen printing. Alternatively, the material 130 is simply solder flux, also applied by any suitable process such as by screen printing. Alternatively, the solder paste or solder flux is applied to the solder masses of the preform 100, rather than to the pads of the electronic component 120, in which case it may be acceptable to dip the entire preform in solder flux.

The preform 100 is brought to bear upon (disposed against) the electronic component 120 so that the solder masses align with corresponding pads. FIG. 1B illustrates the preform 100 positioned against the electronic component 120. As illustrated, it is preferable that the side dimension ("S") of each solder mass is at least (≧) as large as the side dimension (not labelled) of a corresponding pad on the electronic component.

Next, the assembly of preform 100 and electronic component 120 is heated (in a furnace, not shown) to a temperature which is sufficient to reflow the material of the preform 100 (i.e., the solder masses and the solder bridges), without damaging the electronic component. The temperature required to melt (reflow) the solder masses is typically relatively low, as compared with a temperature which would damage a typical electronic component. It is within the scope of this invention that the preform can be made of a material (such as 90:10 lead:tin) with higher melting temperatures, such as may be desired for mounting solder balls to electronic components capable of sustaining such high temperatures (such as ceramic, rather than plastic semiconductor packages).

This results in a plurality (two of many shown) of individual, discrete interconnect structures (solder balls or solder bumps), labelled 132 and 133, being formed upon the pads 122 and 123, respectively, on the surface of the electronic component 120. The solder balls or solder bumps form upon (attach to, adhere to) the pads due to the "wetability" of the pads, and their final rounded shape, as illustrated in FIG. 1C, is a result of surface tension during the liquid phase of the reflow process. In this process, the flimsiness of the solder bridges causes the solder bridges to sever, a portion of each solder bridge migrating (during reflow heating) to each of the adjacent solder masses, and becoming incorporated (subsumed) into the mass of the resulting solder ball or solder bump. (The relationships between the sizes of the solder masses and bridges of the preform, and the resulting solder balls is readily calculable, since no material is lost in the process.)

In this manner, a process has been described for fabricating solder balls or solder bumps on a wide variety of electronic components, such as the electronic component shown in the aforementioned U.S. Pat. No. 5,241,133, using a novel technique in lieu of prior art techniques such as are described in the aforementioned U.S. Pat. No. 4,700,276, U.S. Pat. No. 5,381,848, or U.S. Pat. No. 5,388,327.

As mentioned hereinabove, solder balls are of two types: (1) masses that melt at "moderate" temperatures (e.g., 183° C.) upon reflow; and (2) masses such as of 90:10 lead:tin that typically are not melted. The solder balls (e.g., 132, 133) of the present invention may, of course, be of materials requiring higher than moderate temperatures to melt, such as 280° C., and be melted (the only limitation being that the electronic component to which they are mounted can sustain the higher temperatures required to reflow the preform of these materials).

Although not shown in FIGS. 1A–1B, it is within the scope of this invention that the solder preform 100 be disposed on a carrier, such as a sheet of aluminum, which will provide support for the solder preform during handling of same. Any suitable material may be used for the carrier which is non-wettable (the solder will not stick aggressively to the carrier, especially when the solder is reflowed), and capable of withstanding the heat associated with reflowing the solder preform.

Additionally, the concept of a solder preform lends itself well to providing a plurality of solder preforms on a tape (i.e., a long carrier) so that a series of solder preforms can automatically (by machinery, not shown) be advanced (in the manner of a conveyor belt)into position to be reflowed onto a corresponding series of electronic components.

As previously mentioned, the solder preform of the present invention may be made by any suitable technique such as stamping, extrusion (and cutting off), injection casting, etching, etc.

Figure 2:
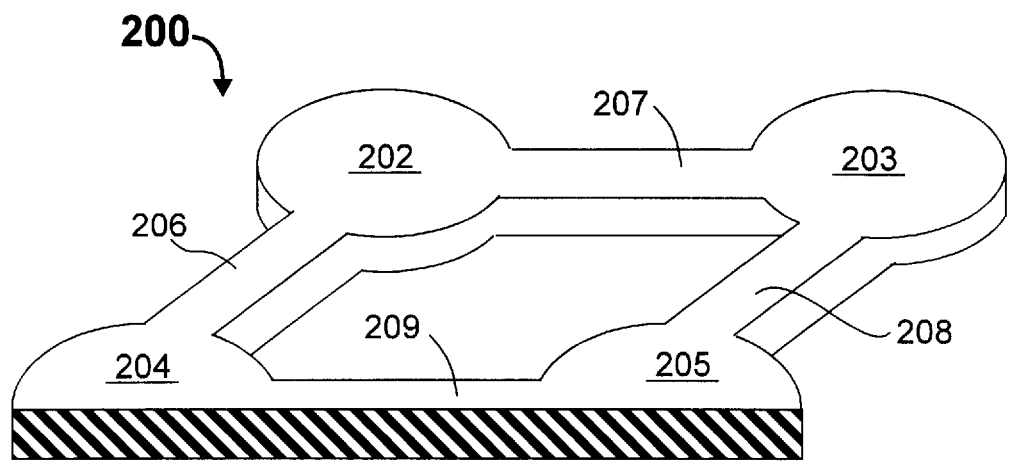
FIG. 2 is a perspective view, partially in cross-section, of another embodiment of a solder preform, according to the invention.

FIG. 2 illustrates a solder preform 200 (compare 100) wherein the solder masses 202, 203, 204 and 205 (compare 102, 103, 104 and 105) are round, rather than rectangular (e.g., square). Additionally, this figure illustrates that the thickness "t" of the bridges 206, 207, 208, 209 may be substantially equal to the thickness "T" of the solder masses 202, 203, 204, 205.

Generally, as described above, the preform (e.g., 100) would be placed onto an electronic component (e.g., 120) and "tacked" to the pads (e.g., 122/123) of same with flux (e.g., 130), heated to reflow the preform, thereby forming individual solder balls (e.g., 132/133) on the pads (terminals) of the electronic component (e.g., a semiconductor package, a wiring substrate, etc.). This contemplates that an electronic component which has thusly been prepared with solder balls would be surface mounted to another electronic component. (However, as mentioned above, the aforementioned U.S. patent application Ser. No. 08/533,584 specifically discusses making socket-like pressure connections to solder balls of an electronic component.)

According to an aspect of the invention, for making more permanent, traditional, surface mount, soldered connections between two electronic components, it is not necessary to first reflow the preform to form balls on the pads of an electronic component.

Figure 3A:
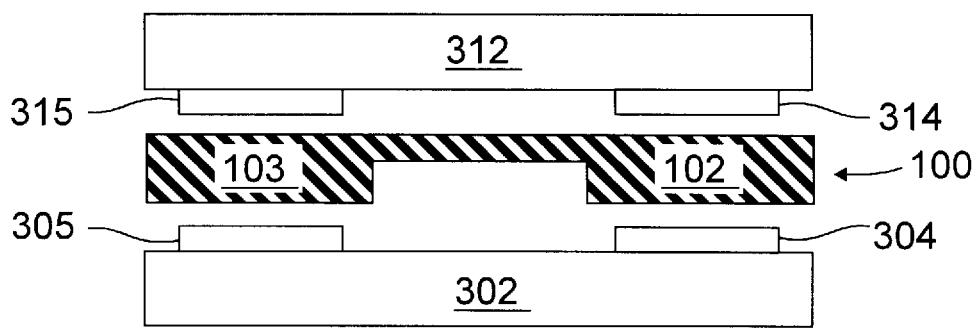
FIG. 3A is an exploded cross-sectional view of a solder preform disposed between two electronic components, for effecting solder joints between same, according to the invention.
Figure 3B:
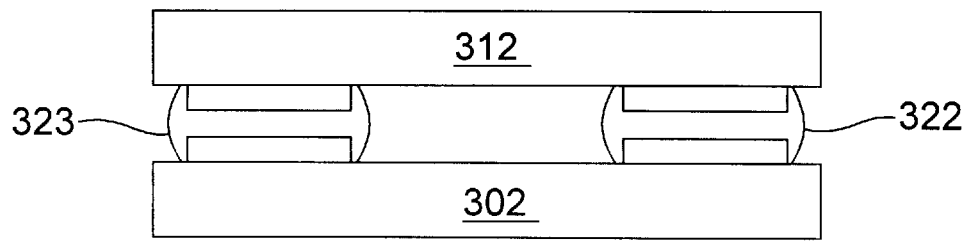
FIG. 3B is a cross-sectional view of two electronic components which have been connected to one another by the solder preform of FIG. 3A.

FIG. 3A illustrates a technique 300 whereby a solder preform such as the preform 100 described hereinabove is disposed (interposed) between a first electronic component 302 having a plurality (two of many shown) of pads (or terminals) 304 and 305 (compare 122 and 123) and a second electronic component 312 having a plurality (two of many shown) of terminals (or pads) 314 and 315 (again, compare 122 and 123). As mentioned hereinabove, the preform 300 can be "tacked" in place with flux (not shown). Then, as illustrated in FIG. 3B the assembly of component 302— preform 100—component 304 is heated to reflow the preform 100, thereby effecting a solder connection between the pads of the first component and the terminals of the second component—bypassing the step of first forming discrete solder balls on either one of the two components. In FIG. 3B, the solder masses 102 and 103 are shown in their reflowed state (with solder bridges subsumed) as solder joints 322 and 323, respectively.

As mentioned above, the solder preform of the present invention can be tacked in place on a surface of an electronic component, or between two electronic components, by flux. It is generally preferred that the preform be held in place prior to reflow, and flux serves the dual purpose of effecting such holding in place and facilitating wetting during reflow.

It is within the scope of this invention that one or more preforms can be held in place by instrumentalities other than flux.

Figure 4:
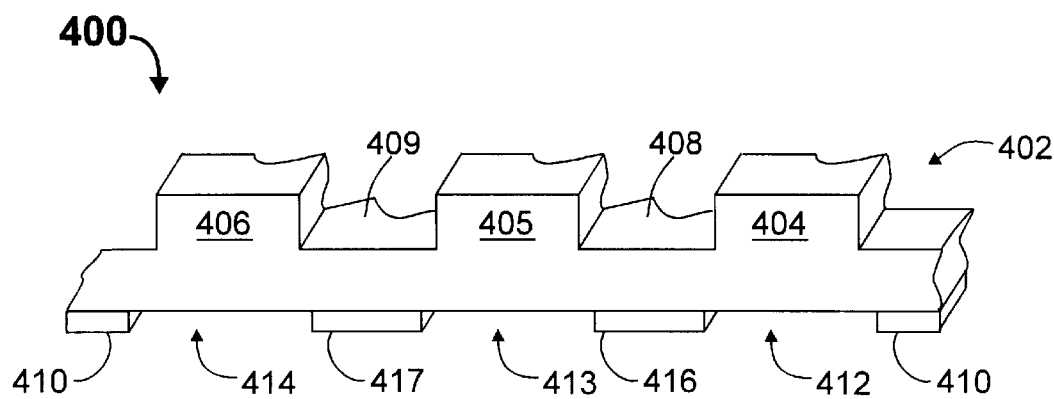
FIG. 4 is a partial perspective view of another embodiment of a solder preform, according to the invention.

FIG. 4 illustrates a solder preform assembly 400 including a solder preform 402 (compare 100) having a plurality (three of many shown) of solder masses 404, 405 and 406 (compare 102, 103, 104 and 105) linked by a plurality of solder bridges 408 and 409 (compare 106, 107, 108, 109). In this example, one or more solder preforms 402 are mounted to a film carrier 410 which is patterned (e.g., punched) to have holes 412, 413 and 414 aligned with the solder masses 404, 405 and 406, respectively. The areas 416 and 417 of the film 410 surrounding the holes align with the solder bridges (e.g., 408 and 409, respectively). The film 410 itself may be "tacky", or may have an adhesive (not shown) applied thereto. In this manner, the preform assembly 400 can be adhered to an electronic component (or between two electronic components) to hold it in place during reflow.

Figure 5A:
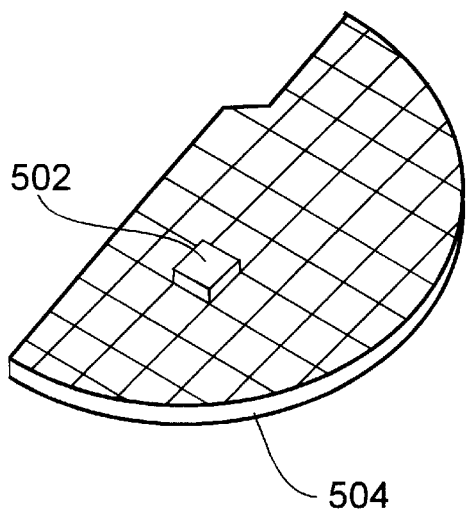
FIG. 5A is a partial perspective view of an embodiment of a solder preform on a semiconductor wafer, according to the invention.

FIG. 5A illustrates that a plurality (one of many shown) of individual solder preforms 502 (compare 100, 200, and preform assembly 402/410), as described hereinabove, can be disposed on individual die sites (unsingulated semiconductor dies, each in areas between intersecting dashed lines in the figure) of a semiconductor wafer 504.

Figure 5B:
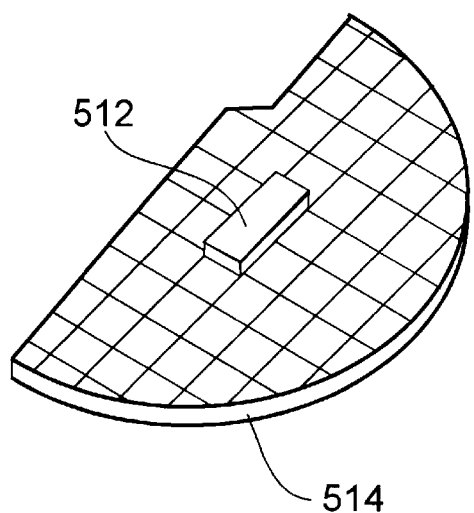
FIG. 5B is a partial perspective view of another embodiment of a solder preform on a semiconductor wafer, according to the invention.

FIG. 5B illustrates that a single solder preform 512 as described hereinabove, can be of sufficient size to span a plurality (two, by way of example) of die sites (unsingulated semiconductor dies) on a semiconductor wafer 514 (compare 504). The solder preform 512 is illustrated in a highly stylized manner in this figure.

AN ALTERNATE EMBODIMENT

Figure 6:
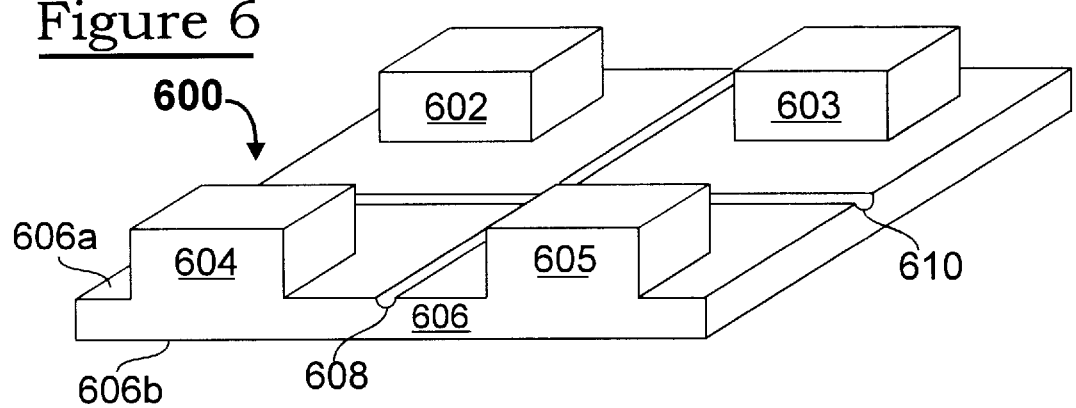
FIG. 6 is a perspective view of an alternate embodiment of a solder preform, according to the invention.

FIG. 6 illustrates an alternate embodiment 600 of the solder preform of the present invention. In this embodiment, the solder masses 602, 603, 604 and 605 (compare 102, 103, 104 and 105) are connected to one another by a single, continuous, preferably planar, sheet 606 of solder, rather than by individual bridges (compare 106, 107, 108 and 109) of solder. The sheet 606 has a top surface 606a and a bottom surface 606b. Preferably, the solder masses 602 . . . 605 are disposed on the top surface 606a of the sheet and are formed integrally with the sheet. A suitable mechanism for fabricating such a solder preform 600 is stamping (e.g., cold forming)—namely, mechanically deforming a sheet of uniform thickness to exhibit relatively large solder masses (602 . . . 605) extending from one side of a relatively thin sheet. In this embodiment, manufacturing is simplified in that there is no need to form holes (voids) between individual solder bridges.

The thickness of the sheet 606 and the initial (prior to reflow) dimensions of the solder masses are readily calculable in a manner similar to the relationships between various dimensions set forth hereinabove. For example, the thickness (t) of the sheet is suitably 1–2 mils, and the dimensions of the solder masses would be comparable to the dimensions for the solder masses (102 . . . 105) set forth hereinabove.

Evidently, upon reflow heating, the sheet will melt first and subsume itself into the solder masses. In order to ensure that substantially equal portions of the sheet subsume into each of the solder masses, it is preferred that a grid pattern (of "weakening" lines) be provided (such as by embossing) on the sheet midway between the solder masses. The grid pattern comprises elongated regions 608 and 610 of reduced thickness—namely, thinner than the nominal thickness of the sheet—in other words, channels running between the solder masses. Upon reflow heating, the sheet 606 will first melt ("fuse") along these grid lines 608 and 610. It is within the scope of this invention that perforations be substituted for the channels.

Figure 6A:
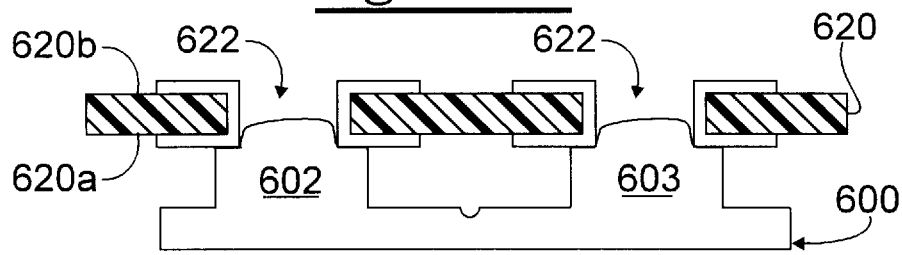
FIG. 6A is a cross-sectional view of the solder preform of FIG. 6 assembled to a circuit board, according to the invention.

Prior to reflow heating the solder preform 600, the solder preform 600 can be assembled to a substrate such as a circuit board. As illustrated in FIG. 6A, a solder preform 600 is urged (upward, as viewed) against a bottom (as viewed) surface 620a of an electronic component (e.g., a circuit board) 620 that has a plurality of plated through holes 622 extending through the circuit board 620 from the top surface 620b to the bottom surface 620a thereof. The solder masses (two solder masses 602 and 603 are visible in this figure) are aligned with the through holes 622. The force with which the preform 600 is urged against the circuit board is sufficient to cause the solder masses (602 and 603) to deform (dimple), extruding themselves into the through holes 622. In this manner, the preform 600 is held in place against the circuit board 620, for further processing. For example, the assembly of preform and circuit board can be heated to reflow the preform so that solder balls are formed on the bottom surface of the substrate 620. The substrate may be a portion of a semiconductor package or, as mentioned hereinabove, simply a printed circuit board having plated through holes.

Prior to reflowing the solder preform, it is evident that it will serve to electrically connect ("short") all of the through holes to one another. This is advantageous in the context of certain further operations that may be performed. For example, as mentioned in the aforementioned U.S. patent application Ser. No. 08/533,584, composite contact structures may be fabricated on a surface of a substrate having conductive areas (terminals) on the surface. It is within the scope of this invention that the solder preform 600 could be urged against the circuit board 620 so that the back side 606b of the solder preform 600 is against the back side 620a of the circuit board 620.

Figure 6B:
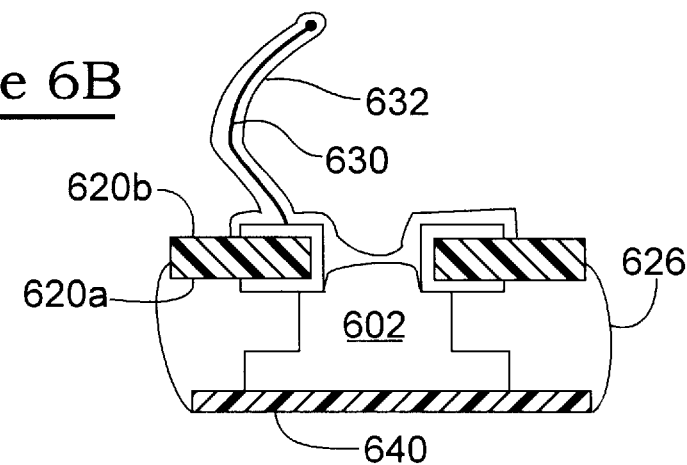
FIG. 6B is a cross-sectional view of the assembly of FIG. 6A, with a resilient contact structure (composite interconnection element) mounted to an opposite side of the circuit board, according to the invention.

FIG. 6B illustrates an assembly of preform 600 and electronic component 620, such as is illustrated hereinabove (FIG. 6A). Preferably, a sealing material 626, such as a polymeric mass or film, is disposed around the periphery of the preform 600 (602). An elongate core element (e.g., a gold wire) 630 is bonded to a portion of each through hole 622 which is exposed on the top (as viewed) surface of the circuit board, and is shaped to have a springable shape. The core element 630 is then overcoated with one or more (one shown) layers 632 of conductive metallic material to form a composite interconnection element (i.e., the overcoated core element). During the overcoating process, the sealing material 626 prevents the preform from being overcoated. As mentioned in the aforementioned U.S. patent application Ser. No. 08/533,584, the overcoat 632 establishes a desired resiliency and/or compliance for the resulting composite interconnection element, and anchors the resulting composite interconnection element securely to the terminal (in this case, the exposed area of the plated through hole) from which it projects.

FIG. 6B also illustrates that, prior to performing the above-mentioned plating (632) operation, it is preferable to mask the back side 606b of the solder preform 600 so that it does not become plated. This can readily be achieved by providing a masking layer 640, in the form of a peel sheet or a spray-on film, to the back side of the preform, prior to plating. The masking layer 640 is preferably an electrical insulator. A peel sheet, for example, may be applied to the back side of the preform prior to assembling same to the circuit board, to provide augmented mechanical support for the preform (e.g., during handling).

It is within the scope of this invention that solder balls can be formed on pads (terminals) or upon vias (pads with holes extending therethrough).

It is within the scope of this invention that the holes 622 through the electronic component 620 need not be plated through holes, in which case the solder masses would be extruded (as described hereinabove) into the through holes. In such a case, the top (as viewed, for example in FIG. 6A surfaces of the solder masses could be plated, and spring elements (compare 630) mounted thereto.

It is within the scope of this invention that the sheet (compare 606) could be extremely thin. For example, an aluminum substrate can be plated with a layer of solder, and the layer of solder could be cold-formed so as to exhibit a plurality of solder masses connected to one another by an extremely thin (i.e., 1 mil or less) sheet of solder, or by extremely thin bridges of solder. In such a case, after heating the preform to reflow the solder masses and solder bridges (or sheet), the aluminum substrate would be released. Such a backing substrate would be comparable in function to the peel sheet (640) described hereinabove.

Figure 6C:
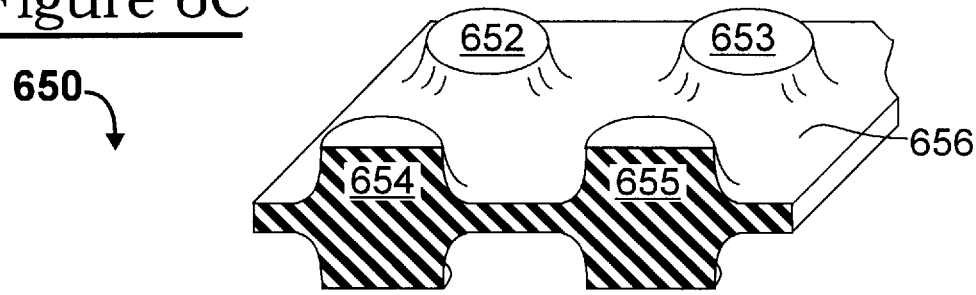
FIG. 6C is a perspective view of an alternate embodiment of a solder preform, according to the invention.

FIG. 6C illustrates an alternate embodiment 650 of the solder preform 600. In this case, rather than the solder masses 652, 653, 654 and 655 (compare 602, 603, 604 and 605) extending from a one side of the interconnecting sheet 656 (compare 606, the preform is cold formed (stamped) from both sides so that the interconnecting sheet 656 intersects a midportion of the solder masses 652 . . . 655.

ANOTHER EMBODIMENT

Figure 7A:
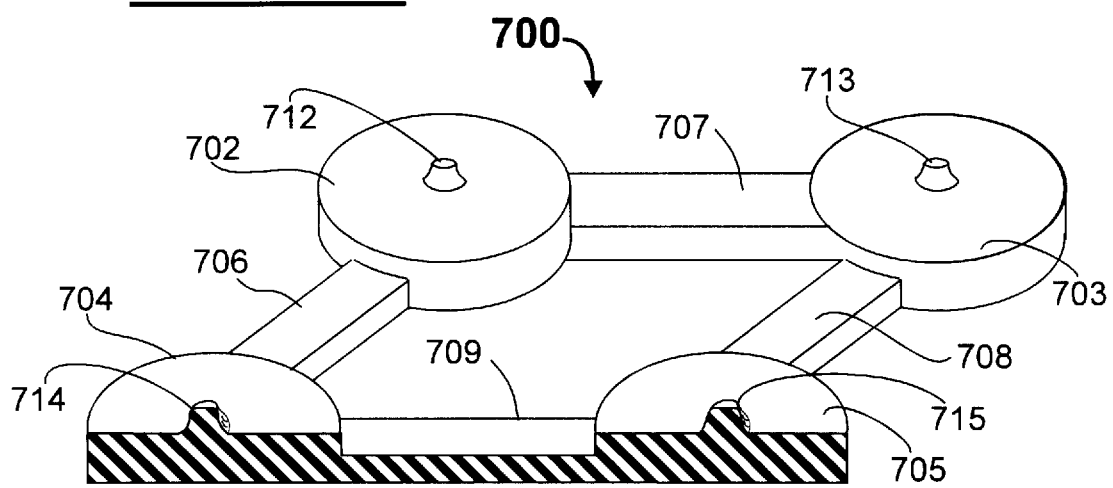
FIG. 7A is a perspective view of an alternate embodiment of a solder preform, according to the invention.

FIG. 7A illustrates a "linked" solder preform 700 of the type described hereinabove with respect to FIGS. 1A and 2. A plurality (four of many shown) of solder masses 702, 703, 704 and 705 (compare 202, 203, 204 and 205) are connected by solder bridges 706, 707, 708 and 709 (compare 206, 207, 208 and 209). In this embodiment, however, the solder masses 702, 703, 704 and 705 are provided with raised areas (features) 712, 713, 714 and 715, respectively on one of their end (top, as viewed) surfaces. This imparts a "texture" to the preform.

Figure 7B:
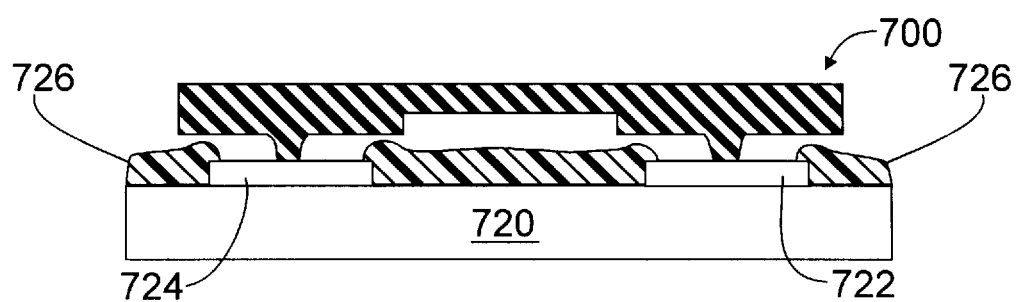
FIG. 7B is a cross-sectional view of the solder preform of FIG. 7A in use with a circuit board, according to the invention.

As shown in FIG. 7B, the solder preform 700 of FIG. 7A can be disposed against an electronic component 720 having a plurality (two of many shown) of terminals 722 and 724 on a front (top, as viewed) surface thereof. A masking material (solder mask) 726 is disposed on the front surface of the electronic component 720, and is patterned to have openings aligned with the terminals, and to cover (mask) any other structures or components which are resident on the front surface of the electronic component 720. The solder preform 700 is disposed so that the solder masses (e.g., 702, 703) are aligned with and against the terminals 722 and 724. In this example, the raised areas (e.g., 712, 713) of the solder masses are in contact with the terminals. The thickness of the masking material is such that is does not prevent the solder masses (or raised areas) from contacting the terminals. The entire assembly (i.e., of solder preform and electronic component) is then heated to reflow the solder preform, so as to form solder balls upon the terminals, in the manner described hereinabove with respect to solder masses linked (e.g., 106) to one another by solder bridges or by a sheet (e.g., 606) of solder.

SOLDER CARRIER

As discussed hereinabove (e.g., with respect to FIG. 6B), there exist applications for resilient contact structures that are capable of being soldered onto another electronic component (such as a motherboard).

Resilient contact structures, also referred to as composite interconnection elements or spring contact elements, are described in greater detail in the aforementioned U.S. patent application Ser. Nos. 08/452,255, 08/340,144, and 08/152,812, and are merely exemplary of the types of contact structures that can be "carried" by the solder carrier of the present invention.

Figure 8A:
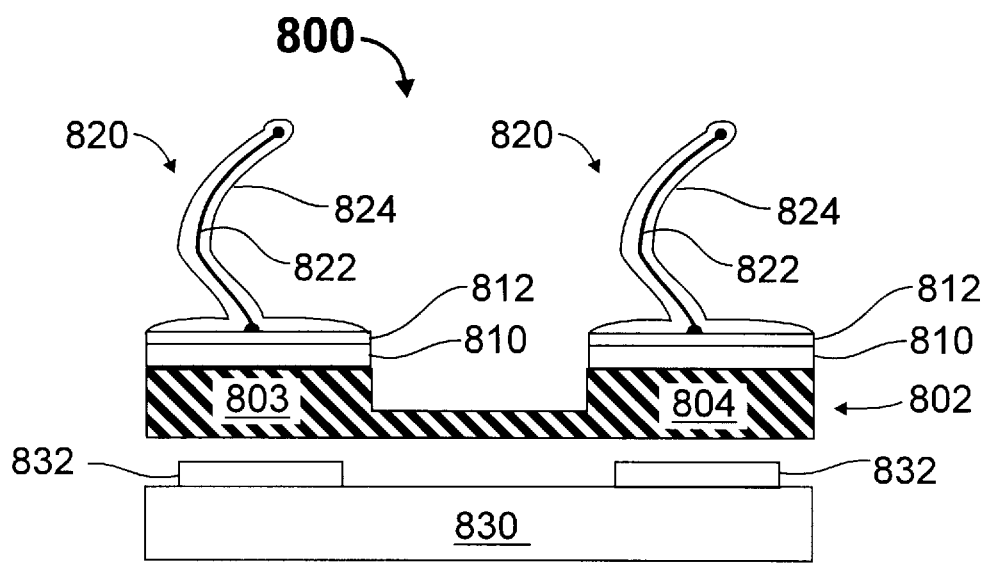
FIG. 8A is a cross-sectional view of a solder carrier with spring contacts, according to the invention.

FIG. 8A illustrates an embodiment 800 of a spring carrier which includes a solder preform 802 similar to the above-described solder preforms—for example, the preform 600 of FIG. 6. The preform 802 has a plurality of distinct solder masses 803 and 804 linked by bridges (compare 106, 206) or by a sheet (compare 606) of solder.

The solder preform 802 is masked (not shown) in any suitable manner, and at least one layer of a metallic material (e.g., nickel) is plated onto the solder preform so that areas of the layer are aligned with the solder masses 803 and 804.

As illustrated, a first layer 810, such as of nickel, can be plated onto the preform 802, followed by a second layer 812, such as of gold. In such a multilayer (810/812) arrangement, the first (e.g., nickel) layer 810 provides mechanical support, and the second (e.g., gold) layer provides electrical joinability (e.g., wire bondability). In this manner, terminals are formed upon which spring elements 820 (composite interconnection elements) can be formed by bonding a wire 822 (e.g., a gold bond wire) to the terminal, shaping the wire 822, and overcoating the wire 822 with at least one layer 824 of a metallic material (e.g., nickel). In this manner, the preform 800 serves as a "carrier" for the spring elements 820, and the spring elements 820 are readily soldered to terminals 832 of an electronic component 830

Figure 8B:
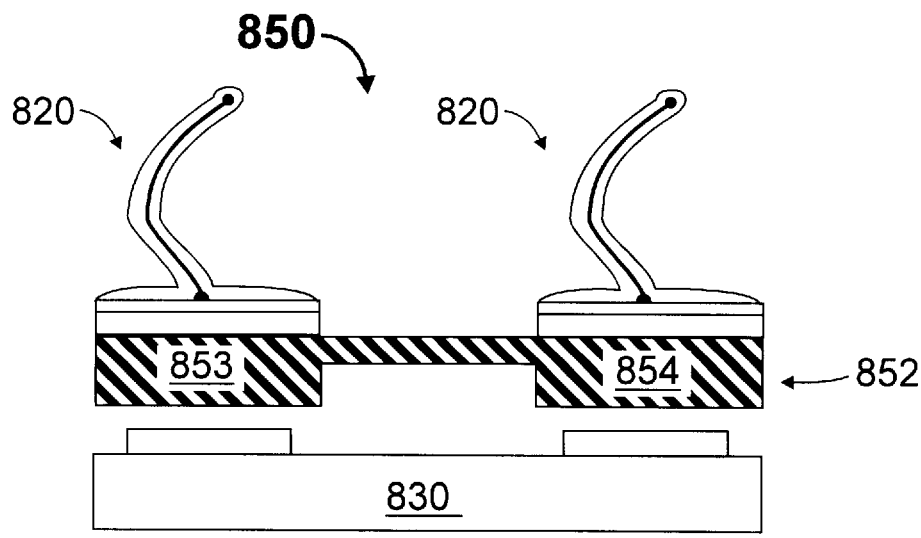
FIG. 8B is a cross-sectional view of an alternate embodiment of a solder carrier with spring contacts, according to the invention.

FIG. 8B shows an alternate embodiment 850 of the spring carrier 800 of FIG. 8A wherein the solder preform 852 (compare 802) is reversed so that the terminals (platings) are formed on the flat surface of the preform 802, opposite the solder masses 853 and 854 (compare 803 and 804). This embodiment 850 is generally preferred.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein. Several of these variations are set forth in the parent case.

For example, although the solder masses of the preform have been described as being square or round in plan view, they may have any desired shape, such as triangular, trapezoidal, etc.

For example, a plurality of solder preforms can be provided as a "ribbon".

For example, the present invention would be useful for forming space transformer substrates having solder bumps on a surface thereof. Consider a space transformer substrate having a plurality of terminals (pads) on one side thereof at one pitch (spacing, from pad to pad) and a plurality of terminals on an opposite side thereof at another pitch. The terminals of the one side are connected to corresponding ones of the terminals of the opposite side, within the substrate. The terminals of the one side can be made solderable, if they are not inherently solderable, using electroless plating techniques to apply a solderable material to the terminals of the one side. A solder preform can then be urged against the terminals of the one side to electrically short the terminals of the one side to one another, as a prelude to electroplating. A barrier (compare 626 can be disposed between the one side of the space transformer and the solder preform to protect the preform during such subsequent electroplating. In this manner, the terminals of the other side can be electroplated with any desired material. Finally, the solder preform can be reflowed to form solder balls on the terminals of the one side.

DISTINCTIONS BETWEEN THE PRESENT INVENTION AND CERTAIN PRIOR ART

The following U.S. Patents, incorporated by reference herein, are cited of interest: U.S Pat. No. 5,242,097; 5,029,748; 4,557,411; 4,216,350; 4,050,621; and 3,932,934, and a representative one of these patents is discussed hereinbelow.

U.S. Pat. No. 5,242,097 (Socha; September 1993; 228/56.3) entitled INTEGRATED PREFORMS, discloses a solder preform containing a series of islands that are joined together in a matrix by bridging bands. At least some of the islands contain pin-receiving holes and tabs that are arranged to frictionally engage a pin extending through the hole. Each bridging band has a reduced cross-sectional area in its midregion. The invention particularly relates to an integrated preform for joining electronic elements to connectors, circuit boards, terminals and the like. In FIG. 6 of the patent, there is illustrated an island without a hole in it. This agrees with the statement made in the abstract that "At least some of the islands contain pin receiving holes." Thus, it appears that this patent does not teach or suggest a preform lacking holes in all of its islands. Nor does this patent teach or suggest that the islands of a preform (comparable to the solder masses of the present invention) will "ball up" when reflowed on a terminal of an electronic component.

An important aspect of the present invention is directed to fabricating solder balls on flat (as opposed to pin-like) terminals of electronic components such as semiconductor packages. Such a use for solder preforms is not taught or suggested by the prior art.

What is claimed is:

1. A solder preform, adapted in use for forming solder balls on a surface of at least one electronic component or for forming solder joints between two electronic components, comprising:

a plurality of relatively large solid solder masses connected to one another by a relatively thin sheet of solder; and weakening lines extending between the solder masses;

wherein:

the weakening lines are regions of reduced thickness.

2. A solder preform, adapted in use for forming solder balls on a surface of at least one electronic component or for forming solder joints between two electronic components, comprising:

a plurality of relatively large solid solder masses connected to one another by a relatively thin sheet of solder;

wherein:

the relatively thin sheet of solder has a thickness; and further comprising:

elongate regions of reduced thickness extending in the sheet between the solder masses.

3. A solder preform, according to claim 2, wherein:

the elongate regions of reduced thickness are in the form of channels running between the solder masses.

4. A solder preform, according to claim 2, wherein:

the elongate regions are arranged in a grid pattern.

5. A solder preform, adapted in use for forming solder balls on a surface of at least one electronic component, comprising:

a plurality of relatively large solid solder masses connected to one another by a relatively small volume amount of solder; and a carrier supporting the solder masses.

6. A solder preform, according to claim 5, wherein:

the relatively small volume of solder is in the form of a thin sheet.

7. A solder preform, according to claim 5, wherein:

the relatively small volume of solder is in the form of bridges connecting the solder masses to one another.

8. A solder preform, according to claim 5, wherein:

the carrier is an aluminum sheet.

9. A solder preform, according to claim 5, wherein:

the carrier is in the form of a tape and supports a plurality of solder preforms.

10. A solder preform, according to claim 5, wherein:

the carrier is in the form of a film.

11. A solder preform, according to claim 10, further comprising:

a plurality of holes in the film, said holes being aligned with the relatively large solder masses.

12. A solder preform, according to claim 10, further comprising:

an adhesive applied to the film.

13. A solder preform, according to claim 5, further comprising:

a plurality of spring elements mounted to the solder preform.

14. A solder preform, according to claim 13, further comprising:

at least one layer of a metallic material disposed between the spring elements and the solder preform.

15. A solder preform, according to claim 13, wherein:

the spring elements are mounted to the relatively large solder masses.

16. A solder preform, according to claim 15, wherein:

the spring elements are composite interconnection elements.

* * * * *